US012772406B2

(12) United States Patent
Ruiz et al.

(10) Patent No.: US 12,772,406 B2
(45) Date of Patent: Oct. 20, 2026

(54) AUTOMATIC REMOTE LATCHING SOLUTION FOR PCB MODULES

(71) Applicant: INTERNATIONAL BUSINESS MACHINES CORPORATION, Armonk, NY (US)

(72) Inventors: Daniel Ruiz, Cold Spring, NY (US); Joseph Scaglione, Poughkeepsie, NY (US); Ryan Elsasser, Salt Point, NY (US); Schuyler Mann, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 18/980,004

(22) Filed: Dec. 13, 2024

(65) Prior Publication Data

US 2026/0173292 A1 Jun. 18, 2026

(51) Int. Cl.

| | |
|---|---|
| ***H05K 7/14*** | (2006.01) |
| ***H01R 13/629*** | (2006.01) |
| ***H01R 43/26*** | (2006.01) |

(52) U.S. Cl.

CPC ..... *H05K 7/1414* (2013.01); *H01R 13/62966* (2013.01); *H01R 43/26* (2013.01); *H05K 7/1409* (2013.01)

(58) Field of Classification Search

CPC ............... H05K 7/1414; H05K 7/1409; H01R 13/62966; H01R 43/26; G06F 1/18; G06F 1/183; G06F 1/185; G06F 1/186

See application file for complete search history.

(56) References Cited

U.S. PATENT DOCUMENTS

| | | | | |
|---|---|---|---|---|
| 3,575,482 A * | 4/1971 | MacMaster | ............ | H01R 13/62 439/372 |
| 6,126,106 A | 10/2000 | Ueda | | |
| 6,409,526 B1 | 6/2002 | Malone et al. | | |
| 6,710,962 B1 | 3/2004 | Caverly et al. | | |
| 6,768,643 B1 * | 7/2004 | Rust | ........................ | G06F 1/183 361/752 |

(Continued)

FOREIGN PATENT DOCUMENTS

| | | |
|---|---|---|
| WO | 2023/003846 A | 1/2023 |

OTHER PUBLICATIONS

"Compact Round-Face DC Motor", 24V DC, 4535 rpm @ 11.5 in.-oz, McMaster Carr, Jan. 23, 2025, 02 Pages.

(Continued)

*Primary Examiner* — Abhishek M Rathod
(74) *Attorney, Agent, or Firm* — Onyx IP Group

(57) ABSTRACT

Automatically engaging and disengaging PCB modules with computing systems includes: receiving, from a computing system and by a printed circuit board (PCB) module, an instruction to disengage the PCB module from the computing system, where the PCB module is coupled to the computing system via a PCB connector included in the PCB module; and triggering, based on the instruction, an automatic latching actuation, where the automatic latching actuation includes: operating one or more rotational actuators included within the PCB module to operate one or more latches coupled to the PCB module, which in turn exert force against a fixed surface of the computing system to linearly unplug the PCB connector from the computing system.

20 Claims, 7 Drawing Sheets

(56) References Cited

U.S. PATENT DOCUMENTS

| | | | | |
|---|---|---|---|---|
| 7,040,675 | B1 | 5/2006 | Ott et al. | |
| 7,516,632 | B2 | 4/2009 | Poppell | |
| 7,666,011 | B2 | 2/2010 | Lim et al. | |
| 8,186,191 | B2 | 5/2012 | Bacon | |
| 8,966,322 | B2 * | 2/2015 | Dickenson | G06F 11/26 714/43 |
| 9,434,536 | B2 | 9/2016 | Genter et al. | |
| 9,723,745 | B2 * | 8/2017 | Qi | G06F 1/18 |
| 9,837,765 | B2 * | 12/2017 | Heiskanen | G06K 7/0069 |
| 10,605,038 | B2 | 3/2020 | Chau et al. | |
| 10,658,000 | B2 | 5/2020 | Hippargi et al. | |
| 11,468,404 | B2 * | 10/2022 | Rahilly | G06Q 20/203 |
| 11,643,842 | B2 | 5/2023 | Chen | |
| 2003/0072139 | A1 * | 4/2003 | Yamaguchi | H05K 7/1407 361/759 |
| 2010/0020662 | A1 | 1/2010 | Bayang et al. | |
| 2017/0297817 | A1 | 10/2017 | Reeb | |

OTHER PUBLICATIONS

"Gear Motor MG-6-120", Motor Torque Analysis, Jan. 23, 2025, 02 Pages.

"Liter 3.7V 300mAh 802025 Lipo Battery Rechargeable Lithium Polymer ion Battery Pack with JST PH 2.0mm Connector", Motor Energy Analysis, Amazon.com, Jan. 23, 2025, 05 Pages.

Abracon LLC, "ADCR-S02R7SA504MB", Capacitors, Digikey, Motor Energy Analysis, Jan. 23, 2025, 05 Pages.

* cited by examiner

AUTOMATIC REMOTE LATCHING SOLUTION FOR PCB MODULES

BACKGROUND

Field of the Disclosure

The field of the disclosure is data processing, or, more specifically, methods, systems, and products for automatically engaging and disengaging printed circuit board (PCB) modules.

Description of Related Art

PCB connectors are used to make a rigid board connection, such as by connecting a PCB module (such as an input/output (I/O) card, dual in-line memory module (DIMM), Peripheral Component Interconnect Express (PCIe) adapters, memory cards, and the like) to another device or system. These PCB connectors are often relatively fragile, require a certain level of precision during installment, and are typically part of important system components. Existing methods of plugging and securing PCB connections require manual operations. Situations that require a user to disengage and reengage such PCB connections (such as unplugging and plugging back in input/output (I/O) cards) introduces opportunities for human error (such as excessive plug force, missed connections, and the like) and inefficiencies.

SUMMARY

Methods, apparatus, and systems for automatically engaging and disengaging PCB modules with computing systems according to various embodiments are disclosed in this specification. In accordance with one aspect of the present disclosure, a method of automatically engaging and disengaging PCB modules with computing systems includes: receiving, from a computing system and by a printed circuit board (PCB) module, an instruction to disengage the PCB module from the computing system, where the PCB module is coupled to the computing system via a PCB connector included in the PCB module; and triggering, based on the instruction, an automatic latching actuation, where the automatic latching actuation includes: operating one or more rotational actuators included within the PCB module to operate one or more latches coupled to the PCB module, which in turn exert force against a fixed surface of the computing system to linearly unplug the PCB connector from the computing system.

In accordance with another aspect of the present disclosure, a system for automatically engaging and disengaging PCB modules with computing systems may include a computing system comprising one or more drawers, where each of the one or more drawers includes a PCB socket and one or more tabs; and a PCB module comprising: a PCB connector configured to be coupled to the computing system via the PCB socket; a latch assembly including one or more latches, one or more DC motors, and one or more rotational actuators coupled to the one or more latches and powered by the one or more DC motors; and a microcontroller configured to: receive, from the computing system, an instruction to disengage the PCB module from the computing system; and trigger, based on the instruction, an automatic latching actuation, where the automatic latching actuation includes: operating the one or more rotational actuators to drive the one or more latches, which in turn exert force against a first interior surface of the one or more tabs to linearly unplug the PCB connector from the PCB socket.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
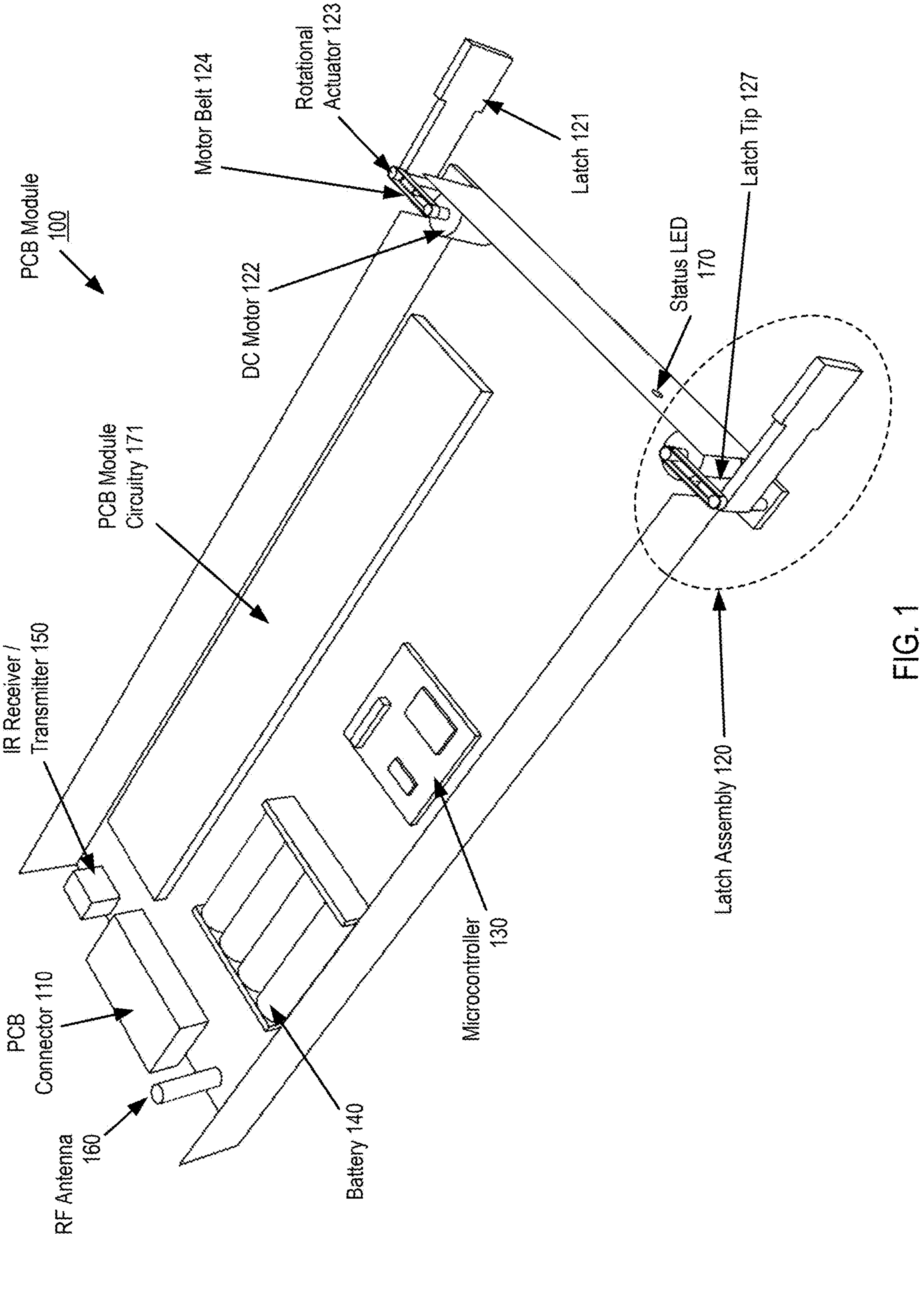
FIG. 1 is a block diagram of an example PCB module configured for automatically engaging and disengaging PCB modules with computing systems in accordance with embodiments of the present disclosure.

Exemplary methods, systems, and products for automatically engaging and disengaging PCB modules with computing systems in accordance with the present disclosure are described with reference to the accompanying drawings, beginning with FIG. 1. FIG. 1 sets forth a block diagram of an example PCB module (such as PCB module 100) configured for automatically engaging and disengaging PCB modules with computing systems in accordance with embodiments of the present disclosure. The example of FIG. 1 includes PCB module 100, which includes PCB module circuitry 171, a PCB connector 110, a latch assembly 120, a microcontroller 130, a battery 140, an infrared (IR) receiver/transmitter 150, a radio frequency (RF) antenna 160, and a status light-emitting diode (LED) 170. The example PCB module 100 may be an I/O card, a DIMM, a PCIe adapter, a memory card, or any other module comprising a PCB connector and configured to be connected (via the PCB connector) to a system or device.

The example PCB module circuitry 171 of FIG. 1 is configured to carry out normal operations of the PCB module. The PCB module circuitry comprises a PCB. The PCB connector 110 is positioned on the rear end of the PCB module and is configured to connect to another device or system. The example PCB connector is a rigid board connector and may include multiple connection pins. In an embodiment where the PCB module is an I/O card, the PCB connector is the connector on the I/O card that is plugged into the computing system to couple the card to the system.

In some embodiments, the PCB connector includes a plug and is configured to couple to a PCB socket on another system or device. In other embodiments, the PCB connector on the PCB module includes the PCB socket and is coupled to a corresponding plug on the system or device. Such a PCB connector 110 thereby provides a pathway for power, instructions, or other signals or data between the PCB module and a connected device or system.

The example latch assembly 120 of FIG. 1 includes a latch 121, a direct current (DC) motor 122, a rotational actuator 123, and a motor belt 124. The example latch assemblies (there are two included in the example of FIG. 1) are positioned on each corner of the front end of the PCB module. The DC motor is configured to drive or operate the rotational actuator 123 via the motor belt 124, thereby rotating the latch 121 around the axis of the rotational actuator 123. When the PCB module is inserted into a rack drawer to be connected to a computing system, the example latches 121 are configured to engage with tabs on the drawer and, upon being rotated by the rotational actuators 123, are configured to pull or push on the tabs to linearly plug or unplug the PCB module into the computing system. That is, the latch assembly is configured to operate one or more rotational actuators 123 included within the PCB module 100 to operate (rotate) one or more latches 121 coupled to the PCB module, which in turn exert force against a fixed surface of the computing system (such as a tab on a drawer) to linearly plug or unplug the PCB connector from the computing system.

In one embodiment, there is a separate DC motor included in the PCB module for each latch or latch assembly (such as is shown in FIG. 1). In another embodiment, a single DC motor may drive multiple different rotational actuators 123, and thus also drive multiple latches. For example, in one embodiment, two latches of a PCB module may be operated by two corresponding motor belts each attached to the same single DC motor included in the PCB module. In another example, two latches of a PCB module may be operated by a single DM motor via worm gears that couple each latch (and their corresponding rotational actuator) to the DM motor.

The example motor belt 124 couples the DC motor to the rotational actuator and is configured to, being driven by the DC motor, operate the rotational actuator 123 to rotate the latch 121. In another embodiment not shown in FIG. 1, a gear box is used instead of the motor belt to couple the rotational actuator to the DC motor. In another embodiment, a worm gear is used instead of the motor belt to operate the rotational actuator. The rotational actuator 123 comprises a vertical pin (on which the latch is positioned) and a mechanism to couple to the motor belt (such as a gear).

The example latch 121 is coupled to the rotational actuator 123 and is configured to rotate around the vertical axis of the rotational actuator 123. The latch 121 includes a first portion extending from the rotational actuator out away from the PCB module. The latch 121 also includes a second, smaller, portion extending from the rotational actuator in a direction perpendicular to the first portion. This second portion comprises the latch tip 127, which is configured to interact with a fixed surface of the computing system (such as an external tab or slot) to linearly pull or push the PCB towards or away from the computing system when the latches are rotated. See FIGS. 2-4 for more detail and additional views of the latches interacting with the above-described tabs. In an embodiment where the latches are positioned in a way that connects the PCB module with the computing system (such as is shown in the example of FIG. 1), the latch tip 127 is positioned to extend from the rotational actuator towards the interior of the PCB module. In an embodiment where the latches are positioned in a way that disconnects the PCB module from the computing system (not shown in FIG. 1), the latch tip 127 is rotated to extend from the rotational actuator away from the PCB module (e.g. away from the front end of the PCB module).

The example microcontroller 130 is configured to control and operate the one or more latch assemblies of the PCB module 100. For example, the microcontroller 130 is configured to receive instructions for operating the latch assemblies and automatically engage or disengage the PCB module from a computing system. The instructions for operating the latch assemblies may be received from a remote system, or from the computing system coupled to the PCB module. Such instructions may be received via the PCB connector 110, and may include an instruction to engage the PCB module with the computing system, an instruction to disengage the PCB module. In one embodiment, an instruction may include both an instruction to disengage the PCB module, and an instruction to reengage the PCB module after a defined amount of time.

In another embodiment, the instructions may be received by the microcontroller 130 via the IR receiver/transmitter 150. In such an embodiment, the instruction is included in an IR signal. In some embodiments, the IR receiver is used to receive instructions when the PCB module is disengaged from the computing system, since the instruction can no longer be received via the PCB connector. In another example, the IR receiver is used to receive instructions while the PCB module is still engaged with the computing system, such as when the PCB connector is not working. Alternatively, such embodiments may be carried out instead by RF antenna 160, where the instructions are included in an RF signal. In one embodiment, the IR receiver/transmitter 150 is configured to send a signal each time the PCB module is connected to or disconnected from the computing system. For example, such signals may be used as part of a security policy to keep the computing system updated with the status of the PCB module (whether or not it is connected to the system). In such an embodiment, the microcontroller 130 may be configured to determine when the PCB module has been coupled to or disengaged from the computing system based on using encoders on the rotational actuators or using voltage signals on the microcontroller. In some embodiments, these signals may be used to keep track of a plug count of the PCB connector.

The example battery 140 of FIG. 1 is configured to provide power to the DC motors included in the one or more latch assemblies of the PCB module. In one embodiment, the DC motors are configured to receive power from the PCB connector while the PCB module is coupled to the computing system. For example, when the microcontroller receives an instruction to disengage the PCB module from the computing system, the DC motors drive the rotational actuators using power provided from the computing system through the PCB connector 110. In some embodiments, the battery 140 is configured to power the latch assemblies whenever the DC motors cannot receive power via the PCB connector (such as when the PCB module is not connected with the computing system). In other embodiments, the battery 140 may be the primary method of providing power to the DC motors. In some embodiments, the battery 140 is a battery pack that includes multiple batteries (as shown in FIG. 1). Alternatively in other embodiments, the battery 140 may be a single battery. In some embodiments (not shown in FIG. 1), a capacitor or a bank of capacitors is used in place of a battery or battery pack to power the DC motors. In some embodiments, a single battery or capacitor is used to power multiple DC motors. In another embodiment, each DC motor may be provided power via a separate battery/pack or capacitor/capacitor bank. In some embodiments, the battery (or capacitor) may be charged via power received through the PCB connector when the PCB module is coupled to the computing system. In one embodiment, the PCB module may be configured to manually charge a capacitor coupled to the latch assembly by manually rotating the latch.

The example status LED 170 is configured to indicate whether the PCB module is connected to the computing system. For example, the status LED may be on when the PCB module is connected to the computing system and may be off when the PCB module is disengaged from the computing system. In some embodiments, the status LED is powered via power delivered from the computing system through the PCB connector.

Figure 2:
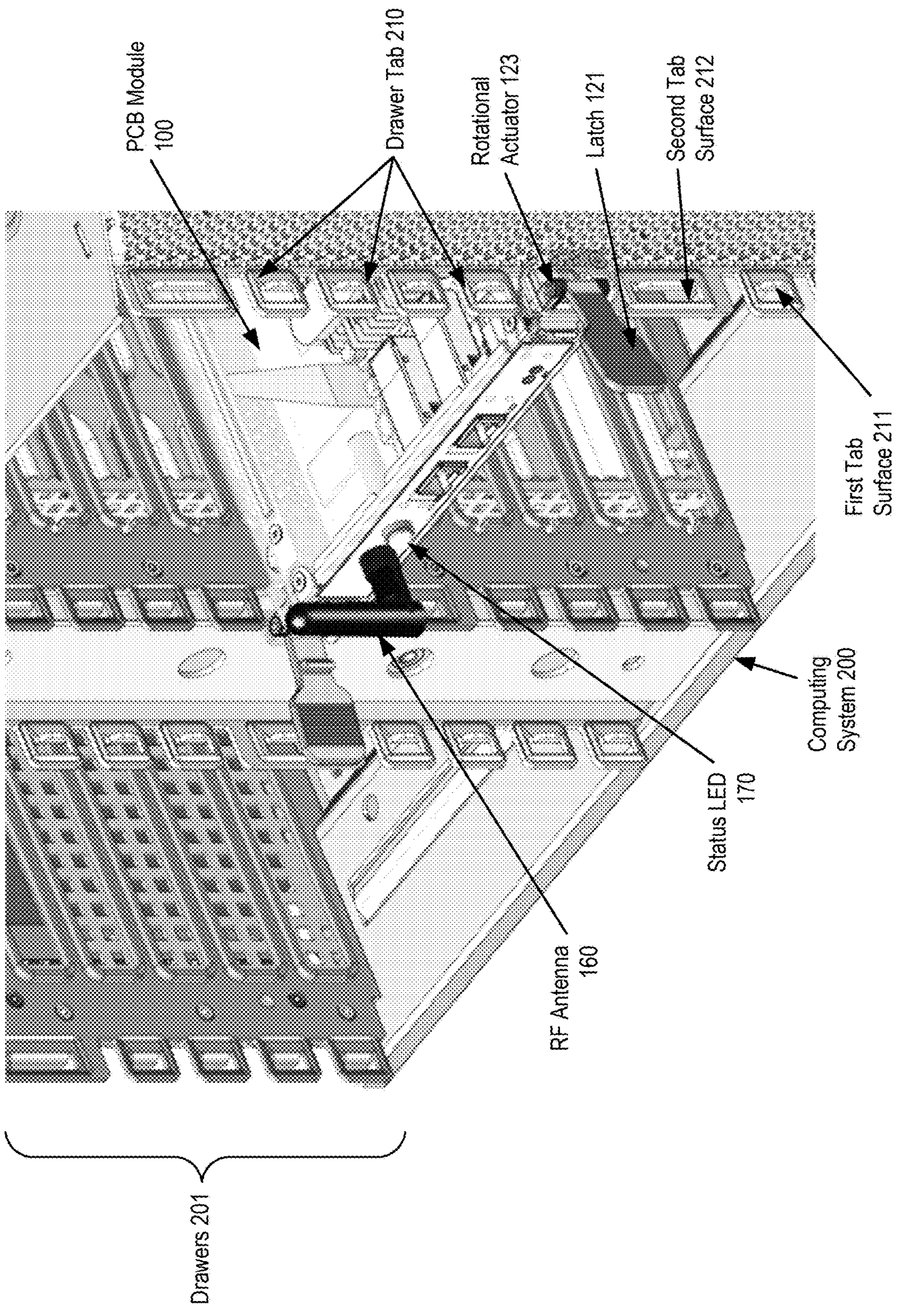
FIG. 2 shows a close-up view of a latch assembly of an example PCB module engaged with a computing system according to some embodiments of the present disclosure.

For further explanation, FIG. 2 shows a view of an example PCB module (such as PCB module 100) engaged with a computing system (such as computing system 200) according to some embodiments of the present disclosure. The example of FIG. 2 includes the PCB module 100 of FIG. 1, including its included RF antenna 160, status LED 170, latches 121, rotational actuators 123, and the like. FIG. 2 also includes computing system 200, which includes a rack having multiple drawers 201 each configured to receive a PCB module. For example, the computing system 200 of FIG. 2 is configured to receive, via a drawer 201, a PCB module 100, where the PCB module is configured to automatically connect or disconnect from the computing system 200 using the latch assemblies and their latches 121.

In the example of FIG. 2, the PCB module is shown as being engaged with (and connected to) the computing system 200. In the example embodiment of FIG. 2, each drawer includes two tabs 210 at the front of the drawer on either side, where each tab is configured to engage with the latches 121 of a PCB module. When the PCB module is connected to the computing system, as shown here in FIG. 2, the latch is positioned so that the latch tip 127 is inserted into the tab 210. In the example embodiment of FIG. 2, the drawer tab 210 includes a slot or opening, with a first tab surface 211 being the vertical interior surface of the tab slot at the back end of the tab slot, and with a second tab surface 212 being the vertical interior surface of the tab slot at the front end of the tab slot. To disengage the PCB module from the computing system, the latch 121 is rotated so that the latch tip exerts force against (and thus pushes against) the first tab surface 211, thereby pushing the PCB module out of the drawer and linearly away from the computing system. To engage the PCB module with the computing system, the latch 121 is rotated so that the latch tip exerts force against (and thus pushes against) the second tab surface 212, thereby pulling the PCB module into the drawer and linearly towards the computing system.

In the embodiments of the present disclosure, the PCB module is configured to automatically, without user action, engage or disengage the PCB module with the computing system. In some embodiments, the latches may also be physically and manually rotated by a user to disengage or engage the PCB module. In one embodiment, the latch is configured to be disengaged from the DC motor (such as by being lifted up in a vertical motion) to allow for easier manual rotation without the resistance of the DC motor. However, in an embodiment where a worm gear is used to drive the rotational actuators, the latches may be fixed and unable to be manually moved.

In one embodiment (not shown in FIG. 2), the drawer includes mechanisms for automatically engaging or disengaging the PCB module with the computing system 200. For example, each of the drawers may include a latch assembly including one or more latches, one or more DC motors, and one or more rotational actuators coupled to the one or more latches and powered by the one or more DC motors, where the latch assembly on the drawers is configured to automatically engage or disengage the PCB module with the drawer. That is, instead of relying on mechanisms included within the PCB module itself for automatically engaging or disengaging the PCB module, the mechanisms may instead be included within the computing system (specifically within the drawers).

Figure 3:
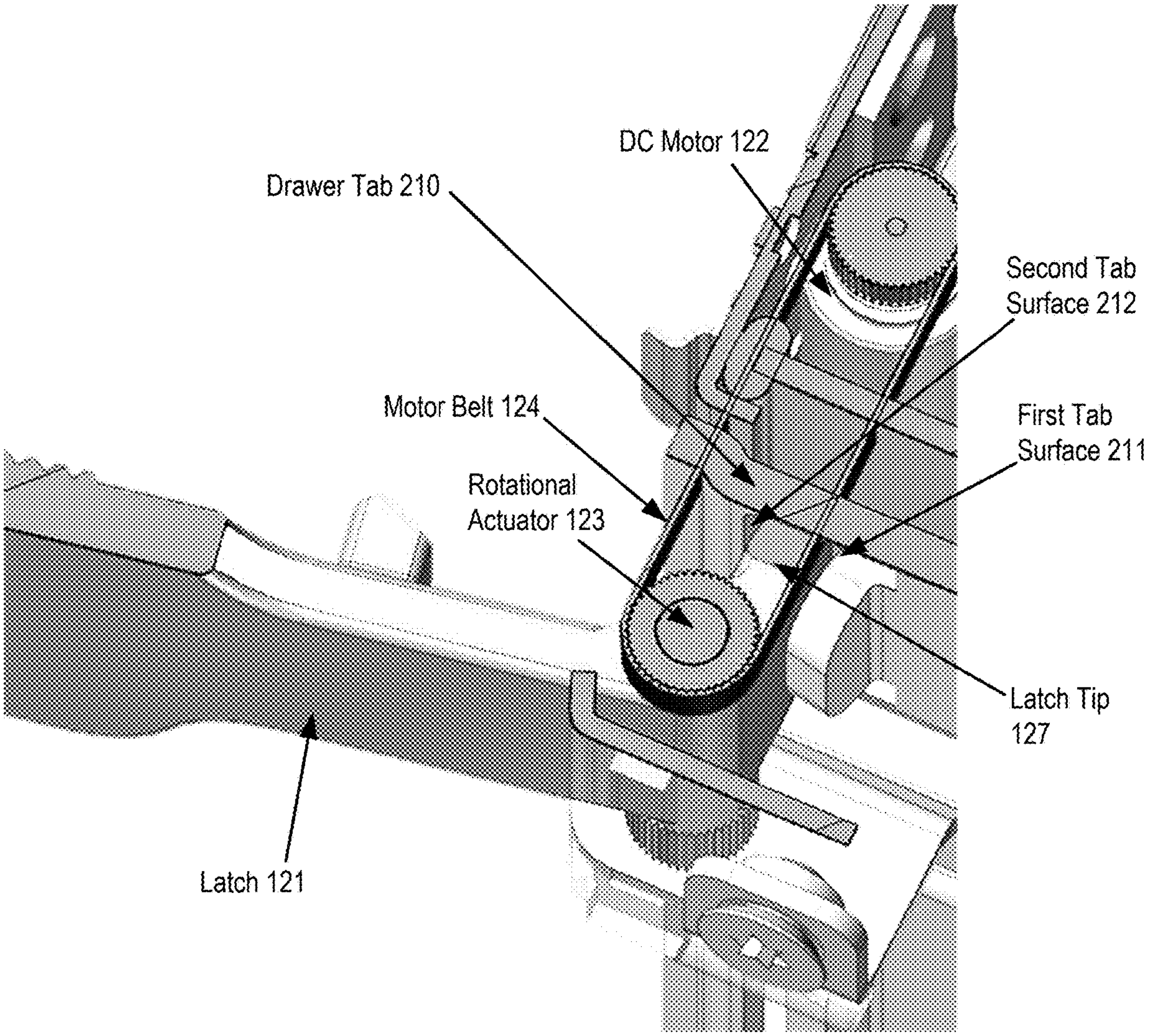
FIG. 3 shows a close-up view of a latch assembly of an example PCB module disengaged from a computing system according to some embodiments of the present disclosure.

For further explanation, FIG. 3 shows a close-up view of a latch assembly of an example PCB module engaged with a computing system according to some embodiments of the present disclosure. Here, FIG. 3 shows a more detailed view of how the latch 121 and the latch tip 127 interacts with the drawer tab 210 and the included first tab surface 211 and second tab surface 212. FIG. 3 also shows a more detailed view of the entire latch assembly and how the DC motor may drive the motor belt 124 to rotate the latch 121.

Figure 4:
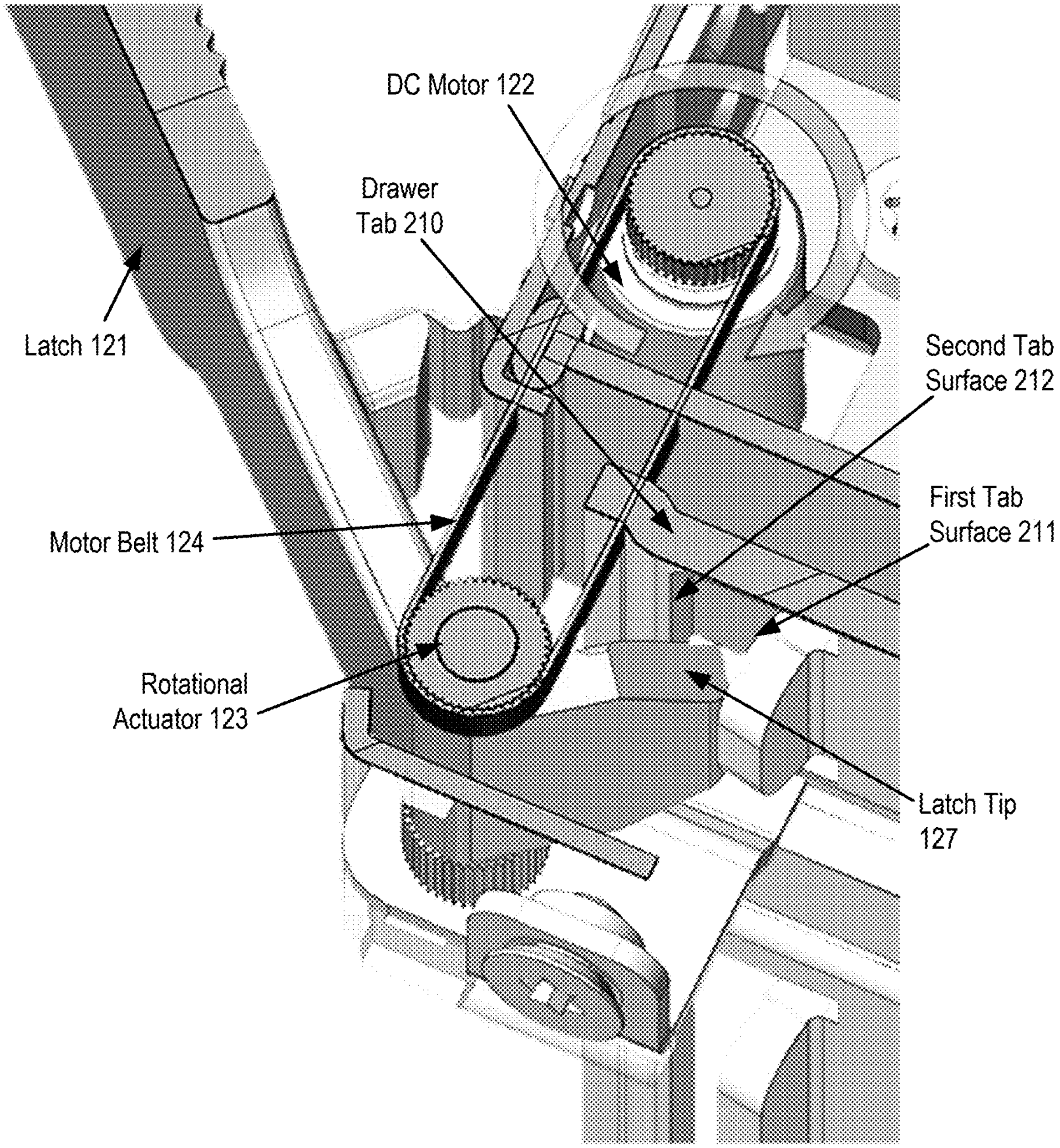
FIG. 4 is a block diagram of an example computing environment configured for automatically engaging and disengaging PCB modules with computing systems according to some embodiments of the present disclosure.

For further explanation, FIG. 4 shows a close-up view of a latch assembly of an example PCB module disengaged from a computing system according to some embodiments of the present disclosure. In the example of FIG. 4, the DC motor has driven the rotational actuator 123 (see the clockwise arrow included in FIG. 4) to rotate the latch 121 so that the latch tip 127 pushes against the first tab surface 211, thereby pushing the PCB module linearly away from the computing system.

Figure 5:
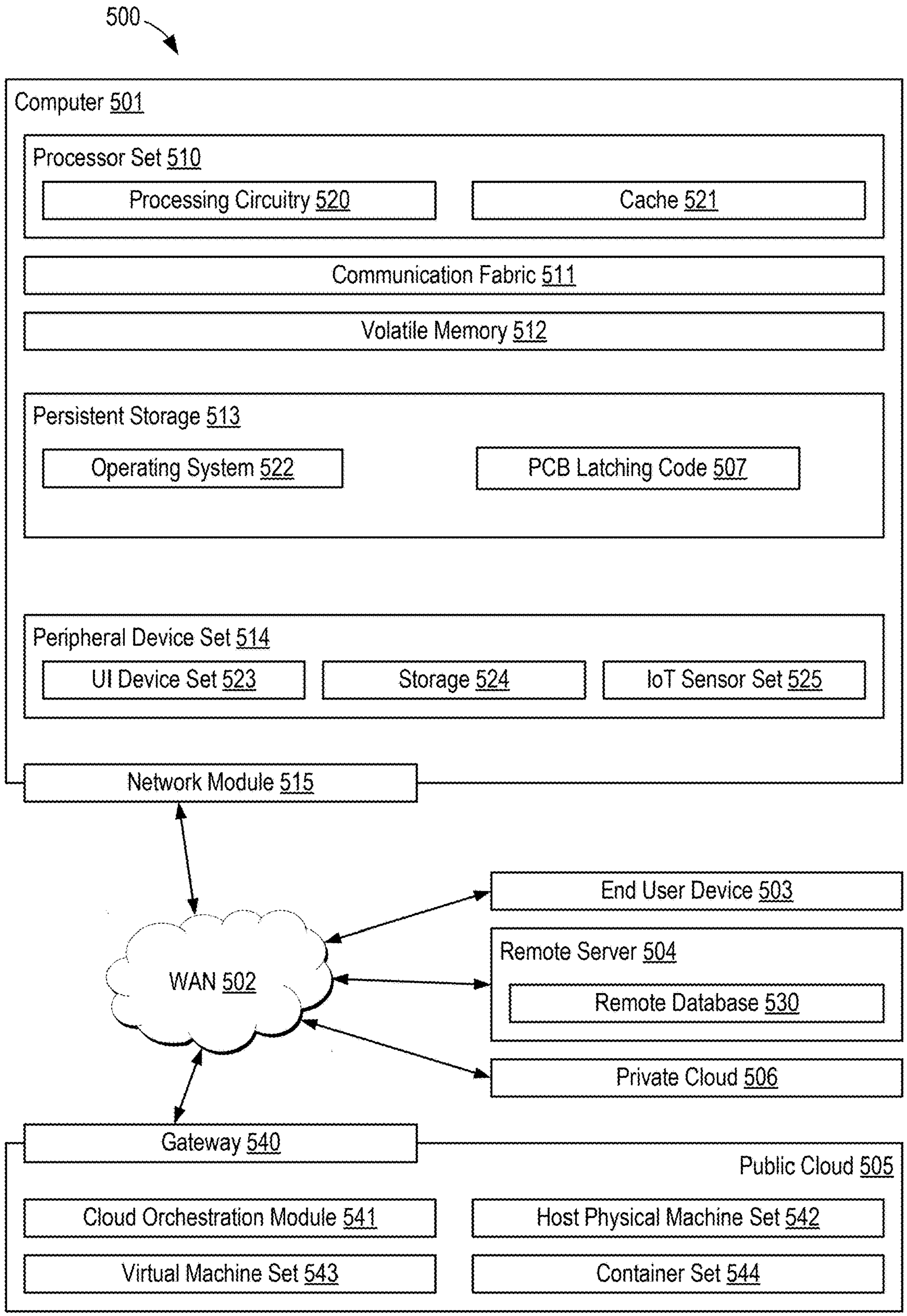
FIG. 5 shows a zoomed-out view of an example PCB module engaged with a computing system according to some embodiments of the present disclosure.

For further explanation, FIG. 5 sets forth a block diagram of computing environment 500 configured for automatically engaging and disengaging PCB modules with computing systems in accordance with embodiments of the present disclosure. Computing environment 500 contains an example of an environment for the execution of at least some of the computer code involved in performing the inventive methods, such as PCB latching code 507 or operating system 522. In addition to PCB latching code 507, computing environment 500 includes, for example, computer 501, wide area network (WAN) 502, end user device (EUD) 503, remote server 504, public cloud 505, and private cloud 506. In this example embodiment, computer 501 may include the computing system 200 shown in FIG. 2, and includes processor set 510 (including processing circuitry 520 and cache 521), communication fabric 511, volatile memory 512, persistent storage 513 (including operating system 522 and PCB latching code 507, as identified above), peripheral device set 514 (including user interface (UI) device set 523, storage 524, and Internet of Things (IoT) sensor set 525), and network module 515. Remote server 504 includes remote database 530. Public cloud 505 includes gateway 540, cloud orchestration module 541, host physical machine set 542, virtual machine set 543, and container set 544. In one embodiment, the PCB latching code 507 is included in the microcontroller 130. In another embodiment, the PCB latching code 507 is included within the computing system coupled to the PCB module 100.

Computer 501 may take the form of a desktop computer, laptop computer, tablet computer, smart phone, mainframe computer, quantum computer or any other form of computer or mobile device now known or to be developed in the future that is capable of running a program, accessing a network or querying a database, such as remote database 530. As is well understood in the art of computer technology, and depending upon the technology, performance of a computer-implemented method may be distributed among multiple computers and/or between multiple locations. On the other hand, in this presentation of computing environment 500, detailed discussion is focused on a single computer, specifically computer 501, to keep the presentation as simple as possible.

Processor set 510 includes one, or more, computer processors of any type now known or to be developed in the future. Processing circuitry 520 may be distributed over multiple packages, for example, multiple, coordinated integrated circuit chips. Processing circuitry 520 may implement multiple processor threads and/or multiple processor cores. Cache 521 is memory that is located in the processor chip package(s) and is typically used for data or code that should be available for rapid access by the threads or cores running on processor set 510. Cache memories are typically organized into multiple levels depending upon relative proximity to the processing circuitry. Alternatively, some, or all, of the cache for the processor set may be located "off chip." In some computing environments, processor set 510 may be designed for working with qubits and performing quantum computing.

Computer readable program instructions are typically loaded onto computer 501 to cause a series of operational steps to be performed by processor set 510 of computer 501 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 521 and the other storage media discussed below. The program instructions, and associated data, are accessed by processor set 510 to control and direct performance of the inventive methods. In computing environment 500, at least some of the instructions for performing the inventive methods may be stored in PCB latching code 507 in persistent storage 513.

Communication fabric 511 is the signal conduction path that allows the various components of computer 501 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

Volatile memory 512 is any type of volatile memory now known or to be developed in the future. Examples include dynamic type random access memory (RAM) or static type RAM. Typically, volatile memory 512 is characterized by random access, but this is not required unless affirmatively indicated. In computer 501, the volatile memory 512 is located in a single package and is internal to computer 501, but, alternatively or additionally, the volatile memory may be distributed over multiple packages and/or located externally with respect to computer 501.

Persistent storage 513 is any form of non-volatile storage for computers that is now known or to be developed in the future. The non-volatility of this storage means that the stored data is maintained regardless of whether power is being supplied to computer 501 and/or directly to persistent storage 513. Persistent storage 513 may be a read only memory (ROM), but typically at least a portion of the persistent storage allows writing of data, deletion of data and re-writing of data. Some familiar forms of persistent storage include magnetic disks and solid state storage devices. Operating system 522 may take several forms, such as various known proprietary operating systems or open source Portable Operating System Interface-type operating systems that employ a kernel. The code included in PCB latching code 507 typically includes at least some of the computer code involved in performing the inventive methods.

Peripheral device set 514 includes the set of peripheral devices of computer 501. Data communication connections between the peripheral devices and the other components of computer 501 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 523 may include components such as a display screen, speaker, microphone, wearable devices (such as goggles and smart watches), keyboard, mouse, printer, touchpad, game controllers, and haptic devices. Storage 524 is external storage, such as an external hard drive, or insertable storage, such as an SD card. Storage 524 may be persistent and/or volatile. In some embodiments, storage 524 may take the form of a quantum computing storage device for storing data in the form of qubits. In embodiments where computer 501 is required to have a large amount of storage (for example, where computer 501 locally stores and manages a large database) then this storage may be provided by peripheral storage devices designed for storing very large amounts of data, such as a storage area network (SAN) that is shared by multiple, geographically distributed computers. IoT sensor set 525 is made up of sensors that can be used in Internet of Things applications. For example, one sensor may be a thermometer and another sensor may be a motion detector.

Network module 515 is the collection of computer software, hardware, and firmware that allows computer 501 to communicate with other computers through WAN 502. Network module 515 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 515 are performed on the same physical hardware device. In other embodiments (for example, embodiments that utilize software-defined networking (SDN)), the control functions and the forwarding functions of network module 515 are performed on physically separate devices, such that the control functions manage several different network hardware devices. Computer readable program instructions for performing the inventive methods can typically be downloaded to computer 501 from an external computer or external storage device through a network adapter card or network interface included in network module 515. Network module 515 may be configured to communicate with other systems or devices, such as sensors 525, for receiving sensor measurements.

WAN 502 is any wide area network (for example, the internet) capable of communicating computer data over non-local distances by any technology for communicating computer data, now known or to be developed in the future. In some embodiments, the WAN 502 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 503 is any computer system that is used and controlled by an end user (for example, a customer of an enterprise that operates computer 501), and may take any of the forms discussed above in connection with computer 501. EUD 503 typically receives helpful and useful data from the operations of computer 501. For example, in a hypothetical case where computer 501 is designed to provide a recommendation to an end user, this recommendation would typically be communicated from network module 515 of computer 501 through WAN 502 to EUD 503. In this way, EUD 503 can display, or otherwise present, the recommendation to an end user. In some embodiments, EUD 503 may be a client device, such as thin client, heavy client, mainframe computer, desktop computer and so on.

Remote server 504 is any computer system that serves at least some data and/or functionality to computer 501. Remote server 504 may be controlled and used by the same entity that operates computer 501. Remote server 504 represents the machine(s) that collect and store helpful and useful data for use by other computers, such as computer 501. For example, in a hypothetical case where computer 501 is designed and programmed to provide a recommendation based on historical data, then this historical data may be provided to computer 501 from remote database 530 of remote server 504.

Public cloud 505 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 505 is performed by the computer hardware and/or software of cloud orchestration module 541. The computing resources provided by public cloud 505 are typically implemented by virtual computing environments that run on various computers making up the computers of host physical machine set 542, which is the universe of physical computers in and/or available to public cloud 505. The virtual computing environments (VCEs) typically take the form of virtual machines from virtual machine set 543 and/or containers from container set 544. It is understood that these VCEs may be stored as images and may be transferred among and between the various physical machine hosts, either as images or after instantiation of the VCE. Cloud orchestration module 541 manages the transfer and storage of images, deploys new instantiations of VCEs and manages active instantiations of VCE deployments. Gateway 540 is the collection of computer software, hardware, and firmware that allows public cloud 505 to communicate through WAN 502.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 506 is similar to public cloud 505, except that the computing resources are only available for use by a single enterprise. While private cloud 506 is depicted as being in communication with WAN 502, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 505 and private cloud 506 are both part of a larger hybrid cloud.

Figure 6:
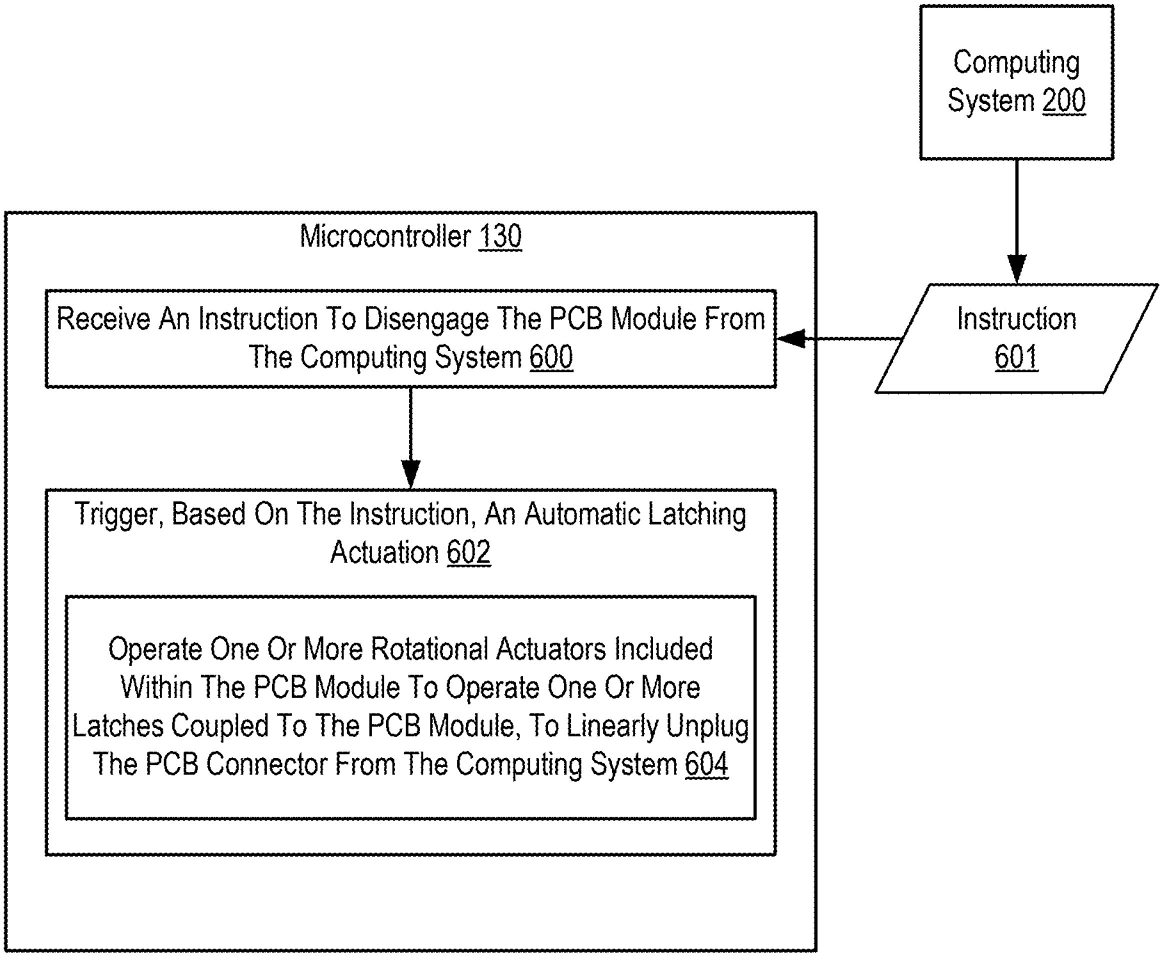
FIG. 6 is a flowchart of an example method for automatically engaging and disengaging PCB modules with computing systems according to some embodiments of the present disclosure.

For further explanation, FIG. 6 sets forth a flow chart illustrating an exemplary method of automatically engaging and disengaging PCB modules with computing systems according to embodiments of the present disclosure. The method of FIG. 6 includes receiving 600, from a computing system and by a PCB module, an instruction to disengage the PCB module from the computing system. The PCB module is coupled to the computing system via a PCB connector included in the PCB module. Receiving 600 an instruction to disengage the PCB module from the computing system may be carried out by microcontroller 130 (in the PCB module) receiving the instruction 601 from the computing system 200. In one embodiment, the instruction 601 is received via the PCB connector while it is connected to the computing system. In another embodiment, the instruction 601 is received via an IR receiver included in the PCB module. In such an embodiment, the instruction is included in an IR signal. In another embodiment, the instruction 601 is received via an RF antenna included in the PCB module. In such an embodiment, the instruction is included in an RF signal. In one embodiment, the instruction may also include a period of time after which to automatically reengage the PCB module with the computing system.

The method of FIG. 6 also includes triggering 602, based on the instruction, an automatic latching actuation. Triggering 602, based on the instruction, an automatic latching actuation includes operating 604 one or more rotational actuators included within the PCB module to operate one or more latches coupled to the PCB module, to linearly unplug the PCB connector from the computing system. Triggering 602 an automatic latching actuation may be carried out by microcontroller 130 by operating DC motors to rotate latches that push the PCB module out away from the computing system, thereby unplugging the PCB connector of the PCB module from the computing system.

Figure 7:
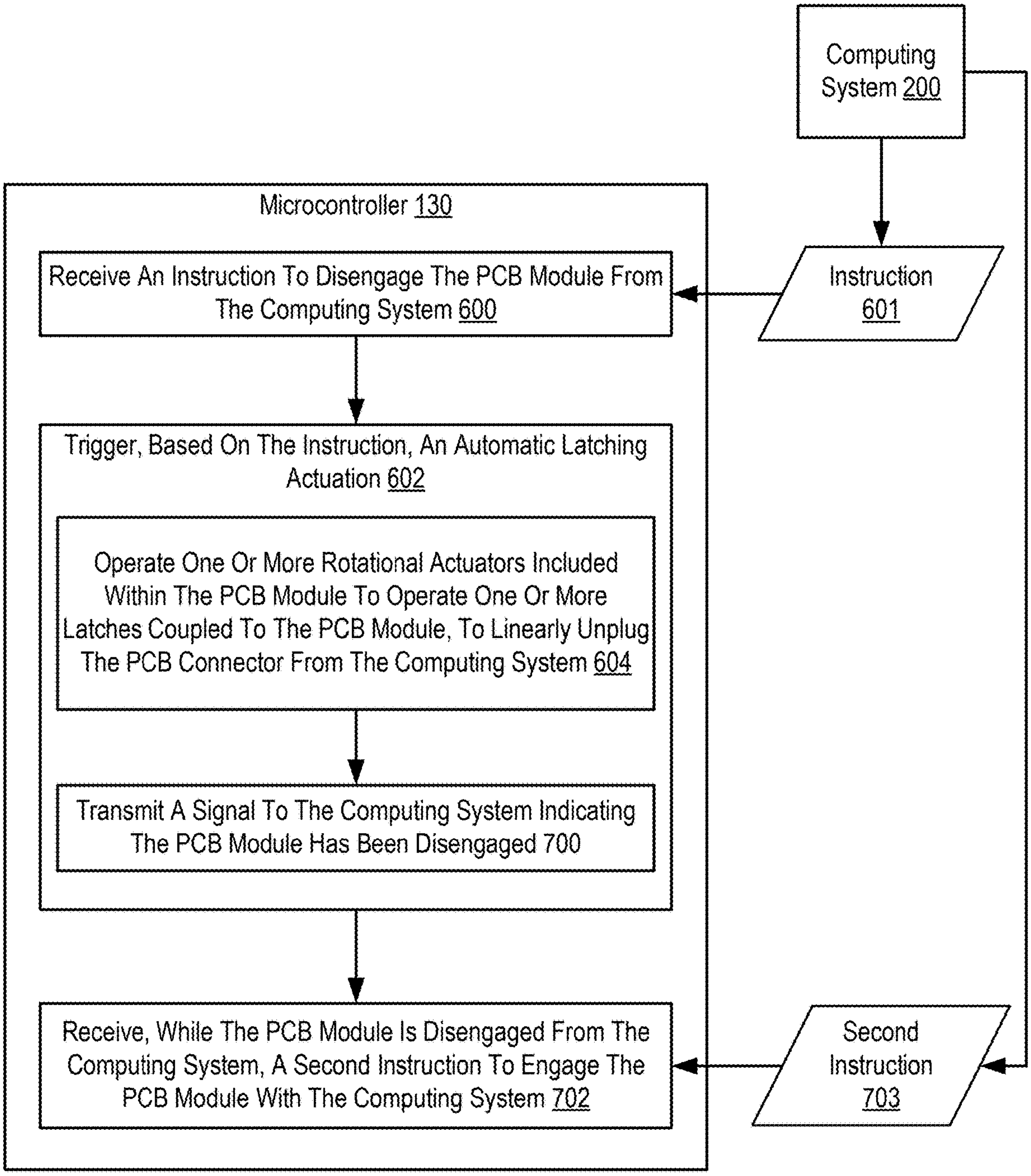
FIG. 7 is a flowchart of another example method for automatically engaging and disengaging PCB modules with computing systems according to some embodiments of the present disclosure.

For further explanation, FIG. 7 sets forth a flow chart illustrating another exemplary method of automatically engaging and disengaging PCB modules with computing systems according to embodiments of the present disclosure. The method of FIG. 7 differs from the method of FIG. 6 in that the method of FIG. 7 further includes, as part of triggering 602, based on the instruction, an automatic latching actuation, transmitting 700 a signal to the computing system indicating the PCB module has been disengaged.

Transmitting 700 a signal to the computing system indicating the PCB module has been disengaged may be carried out by microcontroller 130 determining that the PCB module has been disengaged with the computing system and subsequently sending (via an IR transmitter) the signal.

The method of FIG. 7 also includes receiving 702, while the PCB module is disengaged from the computing system, a second instruction to engage the PCB module with the computing system. Receiving 702, while the PCB module is disengaged from the computing system, a second instruction 703 to engage the PCB module with the computing system may be carried out by the microcontroller 130 while it is disengaged from the system via an IR receiver or an RF antenna (or some other type of receiver). Responsive to receiving the second instruction 703, the microcontroller is configured to reengage the PCB module with the computing system using a second latching actuation to rotate the latches in an opposite direction to pull the PCB module into connection with the computing system.

In view of the explanations set forth above, readers will recognize that the benefits of automatically engaging and disengaging PCB modules with computing systems according to embodiments of the present disclosure include:

Increasing system efficiency and longevity by having PCB connectors be handled automatically and without user input, thereby eliminating possible damage from incorrect or unprecise connector manipulation.

Increasing system efficiency by allowing for faster and automated disengagement and reengagement of connectors.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

receiving, from a computing system and by a printed circuit board (PCB) module, an instruction to disengage the PCB module from the computing system, wherein the PCB module is coupled to the computing system via a PCB connector included in the PCB module; and triggering, based on the instruction, an automatic latching actuation, wherein the automatic latching actuation includes:

operating one or more rotational actuators included within the PCB module to operate one or more latches coupled to the PCB module, which in turn exert force against a fixed surface of the computing system to linearly unplug the PCB connector from the computing system.

2. The method of claim 1, wherein the instruction is received via the PCB connector and by a microcontroller included in the PCB module.

3. The method of claim 1, wherein the instruction is received via an infrared (IR) signal and by an IR receiver included in the PCB module.

4. The method of claim 1, wherein the instruction includes an instruction to automatically reengage the PCB module after a specified amount of time.

5. The method of claim 4, wherein reengaging the PCB module includes triggering a second automatic latching actuation, wherein the second automatic latching actuation includes:

operating the one or more rotational actuators to operate the one or more latches, which in turn exert force against a second fixed surface of the computing system to linearly plug the PCB connector into the computing system.

6. The method of claim 1, further comprising receiving, from the computing system and by the PCB module while it is disengaged from the computing system, a second instruction to engage the PCB module with the computing system.

7. The method of claim 1, wherein operating the one or more rotational actuators is performed by one or more motors in the PCB module, wherein the one or more motors are configured to receive power via the PCB connector.

8. The method of claim 1, wherein operating the one or more rotational actuators is performed by one or more motors in the PCB module, wherein the one or more motors are configured to receive power via a battery included within the PCB module.

9. The method of claim 1, wherein operating the one or more rotational actuators is performed by one or more motors in the PCB module, wherein the one or more motors are configured to receive power via a capacitor included within the PCB module.

10. The method of claim 1, wherein the PCB module is configured to transmit a signal to the computing system each time the PCB module is engaged or disengaged from the computing system.

11. An apparatus comprising:
- a PCB connector configured to be coupled to a computing system;
- a latch assembly including one or more latches, one or more DC motors, and one or more rotational actuators coupled to the one or more latches and powered by the one or more DC motors; and
- a microcontroller configured to:
  - receive, from the computing system, an instruction to disengage the apparatus from the computing system; and
  - trigger, based on the instruction, an automatic latching actuation, wherein the automatic latching actuation includes:
    - operating the one or more rotational actuators to drive the one or more latches, which in turn exert force against a fixed surface of the computing system to linearly unplug the PCB connector from the computing system.

12. The apparatus of claim 11, wherein each latch of the one or more latches is configured to engage or disengage from a corresponding DC motor based on a sliding motion.

13. The apparatus of claim 11, further comprising a battery configured to power the one or more DC motors when the PCB connector is disengaged from the computing system.

14. The apparatus of claim 13, wherein the battery is configured to be charged via the PCB connector when the PCB connector is engaged with the computing system.

15. The apparatus of claim 11, further comprising an infrared (IR) receiver, wherein the microcontroller is configured to receive, from the computing system and via the IR receiver while the apparatus is disengaged from the computing system, a second instruction to engage the apparatus with the computing system.

16. The apparatus of claim 11, further comprising a radio frequency (RF) antenna, wherein the microcontroller is configured to receive, from the computing system and via the RF antenna while the apparatus is disengaged from the computing system, a second instruction to engage the apparatus with the computing system.

17. The apparatus of claim 11, further comprising an infrared (IR) transmitter configured to transmit a signal to the computing system each time the apparatus is engaged with or disengaged from the computing system.

18. A system comprising:
- a computing system comprising one or more drawers, wherein each of the one or more drawers includes a PCB socket and one or more tabs; and
- a PCB module comprising:
  - a PCB connector configured to be coupled to the computing system via the PCB socket;
  - a latch assembly including one or more latches, one or more DC motors, and one or more rotational actuators coupled to the one or more latches and powered by the one or more DC motors; and
  - a microcontroller configured to:
    - receive, from the computing system, an instruction to disengage the PCB module from the computing system; and
    - trigger, based on the instruction, an automatic latching actuation, wherein the automatic latching actuation includes:
      - operating the one or more rotational actuators to drive the one or more latches, which in turn exert force against a first interior surface of the one or more tabs to linearly unplug the PCB connector from the PCB socket.

19. The system of claim 18, wherein the microcontroller is further configured to receive a second instruction to automatically reengage the PCB module with the computing system, wherein reengaging the PCB module includes triggering a second automatic latching actuation, wherein the second automatic latching actuation includes:
- operating the one or more rotational actuators to operate the one or more latches, which in turn exert force against a second interior surface of the one or more tabs to linearly plug the PCB connector into the PCB socket.

20. The system of claim 18, wherein each of the one or more drawers includes a latch assembly including one or more latches, one or more DC motors, and one or more rotational actuators coupled to the one or more latches and powered by the one or more DC motors, wherein the latch assembly on the drawers is configured to automatically engage or disengage the PCB module with the drawer.

* * * * *